US011489093B2

(12) United States Patent
Yamada et al.

(10) Patent No.: US 11,489,093 B2
(45) Date of Patent: Nov. 1, 2022

(54) ILLUMINATION DEVICE AND INFRARED CAMERA-EQUIPPED ILLUMINATION DEVICE

(71) Applicant: NICHIA CORPORATION, Anan (JP)

(72) Inventors: Chihiro Yamada, Anan (JP); Daisuke Iwakura, Komatsushima (JP)

(73) Assignee: Nichia Corporation, Anan (JP)

( * ) Notice: Subject to any disclaimer, the term of this patent is extended or adjusted under 35 U.S.C. 154(b) by 308 days.

(21) Appl. No.: 16/942,983

(22) Filed: Jul. 30, 2020

(65) Prior Publication Data

US 2021/0036192 A1 Feb. 4, 2021

(30) Foreign Application Priority Data

Jul. 31, 2019 (JP) .............................. JP2019-141159

(51) Int. Cl.
| | |
|---|---|
| *H01L 33/50* | (2010.01) |
| *H04N 5/33* | (2006.01) |
| *H04N 5/225* | (2006.01) |
| *H01L 33/00* | (2010.01) |

(52) U.S. Cl.
CPC ........ *H01L 33/504* (2013.01); *H01L 33/0075* (2013.01); *H04N 5/2256* (2013.01); *H04N 5/33* (2013.01)

(58) Field of Classification Search
CPC ...... H04N 5/33; H04N 5/2256; H01L 33/504; H01L 33/0075; H01L 33/44; H01L 33/58
See application file for complete search history.

(56) References Cited

U.S. PATENT DOCUMENTS

| | | | | |
|---|---|---|---|---|
| 7,415,202 | B2 * | 8/2008 | Fujimoto | ............. G06V 10/141 |
| | | | | 362/11 |
| 7,679,672 | B2 | 3/2010 | Chua et al. | |
| 7,756,181 | B2 * | 7/2010 | Kawanishi | .......... H01S 5/02212 |
| | | | | 398/67 |
| 8,035,069 | B2 * | 10/2011 | Toda | .................. H04N 9/04561 |
| | | | | 250/339.05 |
| 8,254,010 | B2 * | 8/2012 | Kimura | .................. H04N 5/332 |
| | | | | 349/96 |
| 8,273,589 | B2 | 9/2012 | Watkins | |
| 8,304,727 | B2 * | 11/2012 | Lee | ...................... H04N 5/2256 |
| | | | | 250/330 |
| 8,465,171 | B2 * | 6/2013 | Kishimoto | ............... B60Q 1/04 |
| | | | | 362/230 |
| 8,633,500 | B2 | 1/2014 | Watkins | |

(Continued)

FOREIGN PATENT DOCUMENTS

| | | | | |
|---|---|---|---|---|
| CN | 107550474 | A * | 1/2018 | .......... A61B 5/0077 |
| CN | 107850531 | A * | 3/2018 | ............. G01N 21/00 |

(Continued)

*Primary Examiner* — Vinh T Lam
(74) *Attorney, Agent, or Firm* — Birch, Stewart, Kolasch & Birch, LLP

(57) ABSTRACT

A illumination device comprises an excitation light source, a first fluorescent material that converts the wavelength of light emitted from the excitation light source and emits light having a light emission peak wavelength in a range of 780 nm or more and 1,600 nm or less, and a cut filter that blocks light in a wavelength range of 870 nm or less, wherein the first fluorescent material contains a fluorescent material having a composition of rare earth aluminate containing Ce and Nd.

15 Claims, 13 Drawing Sheets

(56) References Cited

U.S. PATENT DOCUMENTS

| | | | | |
|---|---|---|---|---|
| 8,658,975 | B2* | 2/2014 | Lee | G01S 7/491 |
| | | | | 250/330 |
| 8,981,278 | B2* | 3/2015 | Toda | H04N 5/369 |
| | | | | 348/277 |
| 9,163,804 | B2* | 10/2015 | Aoki | H01L 33/44 |
| 9,588,269 | B2* | 3/2017 | Hendrix | C23C 14/08 |
| 9,851,542 | B2* | 12/2017 | Huang | G02B 13/14 |
| 9,945,995 | B2* | 4/2018 | Hendrix | H04N 13/254 |
| 10,014,335 | B2* | 7/2018 | Watanabe | H04N 9/04559 |
| 10,020,292 | B2* | 7/2018 | Stoll | H01L 33/507 |
| 10,222,526 | B2* | 3/2019 | Hendrix | G02B 5/207 |
| 10,270,015 | B1* | 4/2019 | Hosokawa | G02F 1/1336 |
| 10,288,233 | B2* | 5/2019 | Jones | F21V 7/30 |
| 10,341,585 | B2* | 7/2019 | Yun | H04N 5/2258 |
| 10,401,683 | B2* | 9/2019 | David | G02B 6/005 |
| 10,574,909 | B2* | 2/2020 | Price | H04N 13/254 |
| 10,593,712 | B2* | 3/2020 | Borthakur | G03B 13/36 |
| 10,605,969 | B2* | 3/2020 | Ishido | H04N 5/33 |
| 10,681,292 | B2* | 6/2020 | Toda | G01S 17/86 |
| 10,700,108 | B2* | 6/2020 | Tamiya | H01L 27/14605 |
| 10,725,216 | B2* | 7/2020 | Hirata | H04N 5/2254 |
| 10,732,333 | B2* | 8/2020 | Norizuki | C09B 69/105 |
| 10,739,339 | B2* | 8/2020 | Bell | G02B 27/141 |
| 10,819,922 | B2* | 10/2020 | Sumi | H04N 5/332 |
| 10,863,116 | B2* | 12/2020 | Ishigami | H04N 9/045 |
| 10,863,163 | B2* | 12/2020 | Aurigema | H04N 5/232 |
| 10,903,401 | B2* | 1/2021 | Hosokawa | H01L 33/504 |
| 11,131,794 | B2* | 9/2021 | Hendrix | G02B 5/281 |
| 11,246,195 | B2* | 2/2022 | Morimoto | A61B 1/0646 |
| 11,258,935 | B2* | 2/2022 | Park | H01L 27/14621 |
| 2006/0038198 | A1 | 2/2006 | Chua et al. | |
| 2006/0082679 | A1 | 4/2006 | Chua et al. | |
| 2009/0231874 | A1 | 9/2009 | Kishimoto et al. | |
| 2011/0227106 | A1 | 9/2011 | Watkins | |
| 2013/0001590 | A1 | 1/2013 | Watkins | |
| 2013/0230294 | A1* | 9/2013 | Sassa | H04N 5/2354 |
| | | | | 386/224 |
| 2014/0362885 | A1* | 12/2014 | Sakuta | H01L 33/60 |
| | | | | 372/44.01 |
| 2015/0293283 | A1* | 10/2015 | Nara | H01L 27/14685 |
| | | | | 359/359 |
| 2015/0341533 | A1* | 11/2015 | Yoshida | G06K 19/06046 |
| | | | | 348/207.1 |
| 2017/0278829 | A1 | 9/2017 | Stoll et al. | |
| 2017/0315327 | A1* | 11/2017 | Lai | G02B 13/004 |
| 2017/0342322 | A1 | 11/2017 | Suzuki | |
| 2019/0081106 | A1* | 3/2019 | Nakata | H04N 5/374 |
| 2019/0109266 | A1* | 4/2019 | Hosokawa | C09K 11/7731 |
| 2019/0110686 | A1* | 4/2019 | Kato | G01N 21/6456 |
| 2019/0207064 | A1* | 7/2019 | Hosokawa | H01L 33/504 |
| 2020/0393601 | A1* | 12/2020 | Chen | G02B 5/285 |
| 2021/0180769 | A1* | 6/2021 | Oshio | H01L 33/58 |

FOREIGN PATENT DOCUMENTS

| | | | | |
|---|---|---|---|---|
| JP | 2006-60238 A | | 3/2006 | |
| JP | 2006-114911 A | | 4/2006 | |
| JP | 2009-224053 A | | 10/2009 | |
| JP | 2010-97829 A | | 4/2010 | |
| JP | 2011-233586 A | | 11/2011 | |
| JP | 2012-129399 A | | 7/2012 | |
| JP | 2013-522916 A | | 6/2013 | |
| JP | 2016-170968 A | | 9/2016 | |
| JP | 2017-531315 A | | 10/2017 | |
| JP | 2017-214442 A | | 12/2017 | |
| JP | 6313760 B2 * | | 4/2018 | B42D 15/00 |
| JP | 2021027074 A * | | 2/2021 | H01L 33/0075 |
| TW | 201732018 A * | | 9/2017 | C09K 11/615 |
| WO | WO-2019124046 A1 * | | 6/2019 | C09K 11/7774 |

\* cited by examiner

ILLUMINATION DEVICE AND INFRARED CAMERA-EQUIPPED ILLUMINATION DEVICE

CROSS-REFERENCE TO RELATED PATENT APPLICATION

This application claims priority to Japanese Patent Application No. 2019-141159, filed on Jul. 31, 2019, the disclosure of which is hereby incorporated reference in its entirety.

BACKGROUND

Technical Field

The present disclosure relates to an illumination device and an infrared camera-equipped illumination device.

Description of Related Art

A light emitting device including a light emitting diode (hereinafter also referred to as "LED") or a laser diode (hereinafter also referred to as "LD"), and a wavelength conversion member containing a fluorescent material, is known. Such a light emitting device is being utilized, for example, in illumination devices for vehicles or general lighting, backlights of liquid crystal display devices, and light sources for projectors. In this specification, the "fluorescent material" is used in the same meaning as a "fluorescent phosphor".

A light emitting device generally emits light in a visible light region, and, for example, Japanese Unexamined Patent Publication No. 2010-097829 discloses a light emitting device that emits light in a near-infrared region together with light in a visible light region for the purpose of melting snow by heat.

The illumination device is being required to emit optimal light according to a visual object. For example, in a medical site where a living body is to be viewed, an illumination device that emits light suitable for visually recognizing the living body is required. The living body contains, for example, water, hemoglobin, and melanin as light absorbers. For example, hemoglobin has a high absorptance of light in a visible light region having a wavelength of less than 650 nm; and in an illumination device using a light emitting device that emits light in a visible light region, light in a visible light region is hardly transmitted through the living body. Therefore, light in a visible light region emitted from a general illumination device is absorbed by the light absorber such as hemoglobin in the living body, and is hardly transmitted through the living body, so that the position of blood vessels or the like, which is a part containing a large amount of hemoglobin in the living body, may be hardly visually recognized. In the case where the illumination device includes a light source that emits light in a near-infrared region for the purpose of easily visually recognizing a specific part in the living body, an object other than the living body may be hardly visually recognized.

SUMMARY

The present disclosure has an object to provide an illumination device capable of emitting both light in a near-infrared region and light in a wavelength range different from the near-infrared region, improving visibility of an object, and selecting a wavelength region of light emitted according to an object or a use environment.

A first embodiment of the present disclosure is an illumination device comprising an excitation light source, a first fluorescent material that converts the wavelength of light emitted from the excitation light source and emits light having a light emission peak wavelength in a range of 780 nm or more and 1,600 nm or less, and a cut filter that blocks light in a wavelength range of 870 nm or less, wherein the first fluorescent material contains a fluorescent material having a composition of rare earth aluminate containing Ce and Nd.

A second embodiment of the present disclosure is an infrared camera-equipped illumination device comprising the illumination device and an infrared camera that photographs an object illuminated by the illumination device.

In accordance with the embodiments of the present disclosure, an illumination device capable of emitting both light in a near-infrared region and light in a wavelength range different from the near-infrared region, improving visibility of an object, and selecting a wavelength region of light emitted according to an object or a use environment, can be provided.

DETAILED DESCRIPTION

Figure 1:
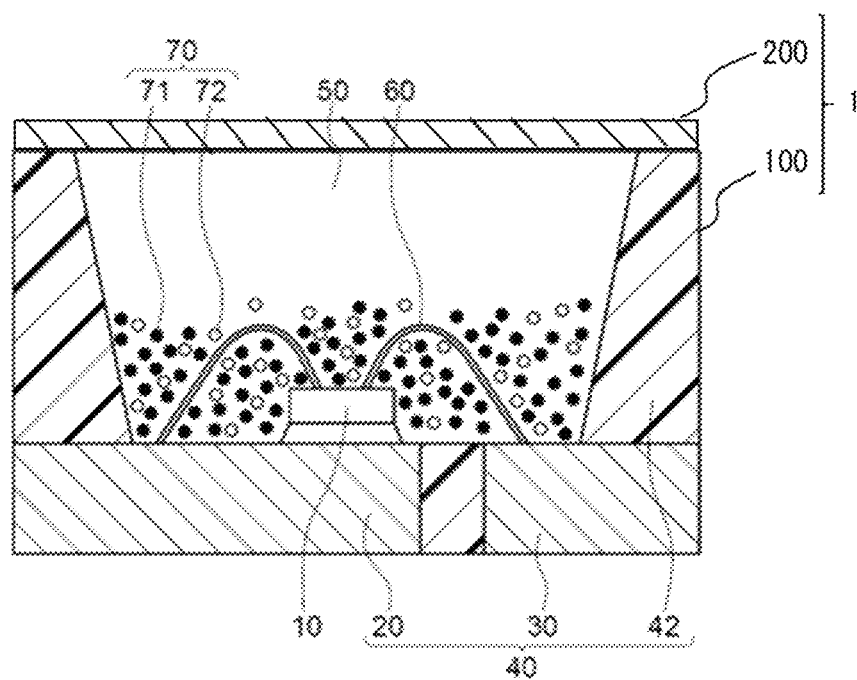
FIG. 1 is a schematic cross-sectional view illustrating a structure of an illumination device according to a first embodiment of the present disclosure.

The embodiments will now be described with reference to the accompanying drawings, wherein like reference numerals designate corresponding or identical elements throughout the various drawings.

The illumination device and the infrared camera-equipped illumination device according to the present disclosure will be hereunder described on the basis of embodiments. The embodiments described below are exemplifications for embodying the technical idea of the present disclosure, and the present disclosure is not limited to the following illumination device and infrared camera-equipped illumination device. Standards according to Japanese Industrial Standard (JIS) Z8110 are applied to the relations between color names and chromaticity coordinates, and the relations between wavelength ranges of light and color names of monochromatic lights. In the present embodiment, the near-infrared region means a wavelength region in a range of 780 nm or more and 3,000 nm or less. The visible light region means a wavelength region in a range of 380 nm or more and less than 780 nm.

Illumination Device

The illumination device includes an excitation light source, a first fluorescent material that converts the wavelength of light emitted from the excitation light source and emits light having a light emission peak wavelength in a range of 780 nm or more and 1,600 nm or less, and a cut filter that blocks light in a wavelength range of 870 nm or less; and the first fluorescent material contains a fluorescent material having a composition of rare earth aluminate containing Ce and Nd.

FIG. 1 is a schematic cross-sectional view showing the constitution of an illumination device 1 according to the first embodiment of the present disclosure. The illumination device 1 includes a light emitting device 100 serving as a light source. The light emitting device 100 includes a light emitting element 10 serving as an excitation light source, and a first fluorescent material 71 that converts the wavelength of light emitted from the excitation light source. The illumination device 1 also includes a cut filter 200 that blocks light in a wavelength range of 870 nm or less. The illumination device 1 may include a plurality of cut filters that block light in a wavelength range other than the wavelength range of 870 nm or less, and may have a cut filter selecting means capable of selecting and using any of a plurality of cut filters. Preferably, the cut filter 200 can be movable disposed so as to block light emitted from the light emitting device 100 in a specific wavelength range, or not to block the light.

The light emitting device 100 serving as a light source of the illumination device 1 includes, for example, a molded body 40, the light emitting element 10, and a fluorescent member 50. The molded body 40 is formed by integrally molding a first lead 20, a second lead 30, and a resin portion 42 containing a thermoplastic resin or a thermosetting resin. The molded body 40 forms a concave portion having a bottom surface and side surfaces, in which the light emitting element 10 is mounted on the bottom surface of the concave portion. The light emitting element 10 has a pair of positive and negative electrodes, and the pair of positive and negative electrodes each are electrically connected to the first lead 20 and the second lead 30 via wires 60. The light emitting element 10 is covered by the fluorescent member 50. For example, the fluorescent member 50 contains the first fluorescent material 71 that converts the wavelength of light emitted from the light emitting element 10, and preferably contains a sealing material. The fluorescent member 50 may contain a second fluorescent material 72 that converts the wavelength of light emitted from the light source and emits light having a light emission peak wavelength in a range of less than 780 nm. A fluorescent material 70 contained in the fluorescent member 50 contains the first fluorescent material 71, and may contain the second fluorescent material 72. The first lead 20 and the second lead 30 connected to the pair of positive and negative electrodes of the light emitting element 10 are partly exposed to the outside of the package constituting the light emitting device 100. The light emitting device 100 is able to emit light upon receiving external power supply via the first lead 20 and the second lead 30.

The fluorescent member 50 used for the light emitting device preferably contains a sealing material. As the sealing material, a resin selected from a thermoplastic resin and a thermosetting resin can be used. In consideration of ease of production, examples of the resin used as the sealing material may include a silicone resin and an epoxy resin. The fluorescent member 50 may contain other components such as a filler, a light stabilizer, and a coloring agent, in addition to the fluorescence material 70 and the sealing material. Examples of the filler may include silica, barium titanate, titanium oxide, and aluminum oxide. The content of the other components other than the fluorescent material 70 and the sealing material in the fluorescent member 50 can be set in a suitable range based on the size and color tone of the targeted light emitting device 100. For example, the content of the other components other than the fluorescent material 70 and the sealing material in the fluorescent member 50 can be set in a range of 0.01 part by mass or more and 20 parts by mass or less relative to 100 parts by mass of the sealing material.

Figure 2:
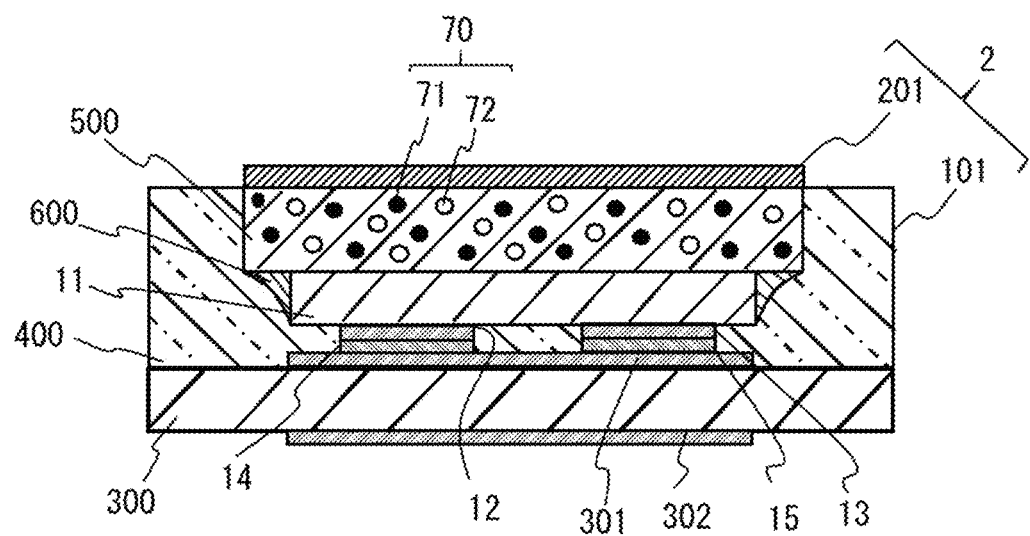
FIG. 2 is a schematic cross-sectional view illustrating a structure of an illumination device according to a second embodiment of the present disclosure.

FIG. 2 is a schematic cross-sectional view showing the constitution of an illumination device 2 according to the second embodiment of the present disclosure. The illumination device 2 includes a light emitting device 101 serving as a light source. The light emitting device 101 includes a light emitting element 11 serving as an excitation light source, and a wavelength conversion member 500 containing a first fluorescent material 71 that converts the wavelength of light emitted from the excitation light source. The illumination device 2 also includes a cut filter 201 that blocks light in a wavelength range of 870 nm or less. The illumination device 2 may include a plurality of cut filters that block light in a wavelength range other than the wavelength range of 870 nm or less, and may have a cut filter selecting means capable of selecting and using any of a plurality of cut filters. Preferably, the cut filter 201 can be movably disposed so as to block light emitted from the light emitting device 101 in a specific wavelength range, or not to block the light.

The light emitting device 101 serving as a light source of the illumination device 2 includes a conductive member 301 such as a wiring pattern for mounting the light emitting element 11 on at least one surface of a support 300. The support 300 may include a conductive member 302 on a surface different from the surface on which the light emitting element 11 is mounted. In the light emitting element 11, electrodes 12 and 13 formed on the light emitting element 11 are connected to the conductive member 301 on the support 300 via connection members 14 and 15 such as bumps. As a method for bonding the conductive member 301 and the light emitting element 11, for example, AuSn bonding, solder bonding, Au bump bonding, or bonding using a conductive adhesive can be cited. The light emitting device 101 includes the wavelength conversion member 500 containing a first fluorescent material 71 in contact with the light emitting element 11. The wavelength conversion member 500 includes a translucent resin and a fluorescent material 70. The fluorescent material 70 contains a first fluorescent material 71, and may optionally contain a second fluorescent material 72. A reflecting member 400 may be provided around the light emitting element 11 and the wavelength conversion member 500. The light emitting device 101 may include a light guide member 600 such that light from the side surface of the light emitting element 11 is incident on the wavelength conversion member 500. The wavelength conversion member 500 is obtained by forming a resin composition containing a liquid resin and a fluorescent material into a sheet shape by a method such as coating, printing, spray coating, compression molding, transfer molding, injection molding, or potting. Examples of the translucent resin used for the wavelength conversion member 500 may include thermosetting resins such as a silicone resin, a silicone-modified resin, an epoxy resin, and a phenol resin, and thermoplastic resins such as a polycarbonate resin, an acrylic resin, a methylpentene resin, and a polynorbornene resin. The resin used for the light guide member 600 can be a resin similar to that used for the wavelength conversion member 500. The wavelength conversion member 500 may use the same resin as or a different resin from that of the light guide member 600.

Examples of the support 300 may include a support including a ceramic such as alumina or aluminum nitride, and a support including a resin containing a fiber-reinforced resin. Examples of the resin constituting the support may include thermosetting resins such as an epoxy resin, a silicone resin, a Bismaleimide Triazine resin (BT resin), a polyimide resin, and an unsaturated polyester resin, and thermoplastic resins such as a polyphthalamide resin and a nylon resin.

An electrically good conductor can be used for the electrode formed on the light emitting element 11, and examples of the electrically good conductor may include metals such as Cu, Au, Ag, and AuSn.

Examples of the reflecting member 400 may include a member formed from a resin composition containing a resin and a material having a good reflectance. Examples of the resin may include thermosetting resins such as an epoxy resin and a silicone resin, and thermoplastic resins such as a polyphthalamide resin. Examples of the material having a good reflectance may include titanium oxide, silicon oxide, zirconium oxide, potassium titanate, aluminum oxide, aluminum nitride, boron nitride, and mullite. The reflecting member may contain a filler or a reinforcing fibers. Examples of the filler may include silica and alumina, and examples of the reinforcing fiber may include glass, calcium silicate, and calcium titanate.

The illumination device emits both light from the excitation light source of the light emitting device, and light in which the wavelength of the light emitted from the excitation light source is converted by the first fluorescent material having a light emission peak wavelength in a range of 780 nm or more and 1,600 nm or less different from the wavelength range of the light from the excitation light source. Also, in the illumination device, light in a wavelength range of 870 nm or less is blocked by a cut filter, and light in a wavelength range of more than 870 nm is emitted from the illumination device. In a living body, hemoglobin, water, melanin, and the like are light absorbers. In a living body, a wavelength region where light is less absorbed by light absorbers such as hemoglobin, water, and melanin, and light is easily transmitted through the living body, may be referred to as a living body window. When light in a wavelength range where the absorptance of the light absorbers in the living body is low is illuminated to the living body, the light incident on the living body is transmitted through the living body and is emitted outside the living body, so that the visibility of the presence of a living body and information on the inside of the living body such as the position of blood vessels in the living body can be improved. Further, by the light emitted from the excitation light source, the visibility of the presence of a living body and the position of blood vessels or the like in the living body can be improved without lowering the visibility of a general object other than the living body.

Furthermore, by using a cut filter that blocks light in a wavelength range of 870 nm or less, the illumination device is able to illuminate an object with light in a wavelength range of more than 870 nm and 1,600 nm or less where the absorptance of the light absorbers in the living body is low. For example, hemoglobin, which is one of the light absorbers in the living body, has a low absorptance of light in the near-infrared region exceeding 870 nm. Therefore, by blocking the light in the wavelength range of 870 nm or less with the cut filter, the light emitted from the illumination device is more easily transmitted through the living body, and the visibility of blood vessels or the like in the living body is improved. By detecting the intensity or the scattering property of the light emitted through the living body, information on the living body can be obtained in more detail without contacting the living body.

Excitation Light Source

The excitation light source preferably emits light having a light emission peak wavelength in a range of 250 nm or more and 500 nm or less. When the excitation light source emits light having a light emission peak wavelength in a range of 250 nm or more and 500 nm or less, the wavelength of the light emitted from the excitation light source is converted by the first fluorescent material, light having a light emission peak wavelength in a range of 780 nm or more and 1,600 nm or less is emitted from the illumination device, and light in a range of the near ultraviolet region and the visible light region emitted from the excitation light source of the light emitting device is also emitted from the illumination device, so that the visibility of a living body can be improved without lowering the visibility of a general object. The illumination device may include a plurality of excitation light sources.

More preferably, the excitation light source emits light having a light emission peak wavelength in a range of 300 nm or more and 490 nm or less, even more preferably in a range of 350 nm or more and 490 nm or less, still more preferably in a range of 380 nm or more and 480 nm or less, and particularly preferably in a range of 380 nm or more and 450 nm or less. The excitation light source may emit light having a light emission peak wavelength in a range of 380 nm or more and 420 nm or less. When the light emission peak wavelength of the light emitted from the excitation light source falls within a range of 250 nm or more and 500 nm or less, the first fluorescent material is excited by the light emitted from the excitation light source, and light having a light emission peak wavelength in a range of 780 nm or more and 1,600 nm or less is emitted from the illumination device. When the excitation light source emits light having a light emission peak wavelength in a range of 380 nm or more and 420 nm or less, light in a wavelength range having a germicidal effect against bacteria in an environmental atmosphere can be emitted from the illumination device, and light having a sterilization effect can be emitted from the illumination device. In the present embodiment, the "sterilization" means sterilizing bacterial in a targeted environmental atmosphere and reducing the number of bacteria.

As the excitation light source, a light emitting element can be used. As the light emitting element, a semiconductor light emitting element is preferably used. By using a semiconductor light emitting element as the excitation light source, an illumination device having a stable excitation light source which is high in linearity of an output against an input with high efficiency and strong against a mechanical impact can be provided. The semiconductor light emitting element is preferably a nitride-based semiconductor light emitting element, and more preferably a GaN-based semiconductor light emitting element. As the nitride-based semiconductor light emitting element, for example, a GaN-based semiconductor light emitting element having a composition represented by $In_xAl_yGa_{1-x-y}N$ ($0 \leq X$, $0 \leq Y$, $X+Y \leq 1$) can be used. The full width at half maximum of the light emission spectrum of the light emitting element may be, for example, 30 nm or less. In the present embodiment, the full width at half maximum refers to a full width at half maximum (FWHM) of the light emission peak in the light emission spectrum, and means a wavelength width of the light emission peak that indicates a value of 50% of the maximum value of the light emission peak in each light emission spectrum.

First Fluorescent Material

The first fluorescent material is a fluorescent material that converts the wavelength of light emitted from the excitation light source and emits light having a light emission peak wavelength in a range of 780 nm or more and 1,600 nm or less. The first fluorescent material contains a fluorescent material having a composition of rare earth aluminate containing Ce and Nd. When the first fluorescent material converts the wavelength of light emitted from the excitation light source and emits light having a light emission peak wavelength in a range of 780 nm or more and 1,600 nm or less, the first fluorescent material may contain a fluorescent material having other compositions other than the fluorescent material having a composition of rare earth aluminate containing Ce and Nd.

The light emission peak wavelength of the light emitted from the first fluorescent material is preferably in a range of 780 nm or more and 1,400 nm or less, more preferably in a range of 780 nm or more and 1,200 nm or less, and even more preferably in a range of 800 nm or more and 1,100 nm or less. When the light emitted from the excitation light source is absorbed; the wavelength of the light is converted by the first fluorescent material; and the light emission peak wavelength of the light emitted from the illumination device falls within a range of 780 nm or more and 1,600 nm or less, light in a wavelength range where the absorptance of the light absorbers in the living body is low can be emitted from the illumination device, the visibility of the living body can be improved, and information on the inside of the living body can be more easily obtained. Water, which is one of the light absorbers in the living body, has a high absorptance of light in wavelength ranges of around 1,000 nm, around 1,450 nm, and around 2,000 nm. Therefore, when the light in a wavelength range, excluding around these wavelengths, where the absorptance of the light absorbers in the living body is low can be emitted from the illumination device, the visibility of the living body can be improved, and information on the inside of the living body can be more easily obtained.

The first fluorescent material preferably contains a fluorescent material having a composition containing; at least one rare earth element Ln selected from the group consisting of Y, Gd, Sc, Lu, and La; at least one element selected from Al and Ga; Ce; and Nd. When the first fluorescent material has a composition of rare earth aluminate containing Y as a rare earth element, Al, Ce, and Nd, the composition may be represented as $Y_3Al_5O_{12}$:Ce,Nd, or may be represented as YAG:Ce,Nd. When the first fluorescent material has a composition of rare earth aluminate containing; a rare earth element Ln other than Y, specifically at least one rare earth element Ln selected from the group consisting of Gd, Sc, Lu, and La; Al; Ce; and Nd, the composition may be represented as $Ln_3Al_5O_{12}$:Ce,Nd, or may be represented as LnAG:Ce, Nd. In the present embodiment, in the formulae representing the compositions of the fluorescent materials, the part before the colon (:) represents elements and the molar ratios constituting a host crystal, and the part after the colon (:) represents activating elements.

As for the molar ratio of each element contained in the composition of rare earth aluminate, on the basis of the total molar ratio of Al and Ga of 5, when the total molar ratio of the rare earth element Ln, Ce, and Nd is 3; the molar ratio of Ce is the product of 3 and the parameter x; and the molar ratio of Nd is the product of 3 and the parameter y, the parameter x is preferably in a range of 0.003 or more and 0.015 or less, and the parameter y is preferably in a range of 0.002 or more and 0.06 or less. In the present embodiment, the "molar ratio" means the molar amount of each element constituting the chemical composition in 1 mol of the chemical composition of the fluorescent material.

The value of the parameter x in the composition of rare earth aluminate is more preferably in a range of 0.004 or more and 0.012 or less, and even more preferably in a range of 0.005 or more and 0.010 or less. The value of the parameter y in the composition of rare earth aluminate is more preferably in a range of 0.004 or more and 0.040 or less, and even more preferably in a range of 0.005 or more and 0.030 or less. In the fluorescent material having the composition of rare earth aluminate, Ce and Nd are activating elements. In the fluorescent material having the composition of rare earth aluminate, the molar amount of Ce is represented by a numerical value of the product of 3 and the parameter x, and the molar amount of Nd is represented by a numerical value of the product of 3 and the parameter y. In the fluorescent material having the composition of rare earth aluminate, by containing both Ce and Nd, the excitation energy absorbed by Ce is transmitted to Nd, and both Ce and Nd emit light, so that light having high light emission intensity is emitted. In the fluorescent material having the composition of rare earth aluminate, when the molar amount of Ce is too large, the light emission intensity may be lowered due to concentration quenching; and when the molar ratio of Ce is too small, the crystallinity of the garnet crystal structure of the rare earth aluminate serving as a host may decrease and the light emission intensity may be lowered. In the fluorescent material having the composition of rare earth aluminate, when the molar amount of Nd is too small, the amount of the element serving as a light emission center may decrease and the light emission intensity may be lowered; and when the molar amount of Nd is too large, the light emission intensity may be lowered due to concentration quenching.

In order to emit light in the near-infrared region from the fluorescent material having the composition of rare earth aluminate, the rare earth element Ln contained in the composition of rare earth aluminate is preferably at least one element selected from the group consisting of Y, Gd, Sc, and Lu. The rare earth element Ln may be one kind or two or more kinds of the elements. The rare earth element Ln preferably contains Y or Lu, and more preferably contains Y.

The first fluorescent material preferably contains a fluorescent material having a composition represented by the following formula (I).

$$(Ln_{1-x-y}Ce_xNd_y)_3(Al_{1-z}Ga_z)_5O_{12} \quad (I)$$

wherein Ln represents at least one rare earth element selected from the group consisting of Y, Gd, Sc, Lu, and La; and x, y, and z satisfy $0.003 \le x \le 0.015$, $0.002 \le y \le 0.06$, and $0 \le z \le 0.8$, respectively.

In the formula (I), the parameter x may satisfy $0.004 \le x \le 0.012$, or $0.005 \le x \le 0.010$. In the formula (I), the parameter y may satisfy $0.004 \le y \le 0.040$, or $0.005 \le y \le 0.030$. In the formula (I), the parameter z represents the amount of Ga contained in the fluorescent material composition in place of Al, and when the parameter z satisfies $0 \le z \le 0.8$, a decrease in crystallinity of the garnet crystal structure of the fluorescent material serving as a host can be suppressed. In the formula (I), the parameter z may satisfy $0 \le z \le 0.6$.

The rare earth element Ln may contain two kinds of rare earth elements Ln1 and Ln2 selected from the group consisting of Y, Gd, Sc, Lu, and La. When the rare earth element Ln contains two kinds of rare earth elements Ln1 and Ln2, the molar ratio of the rare earth element Ln1 is preferably larger than that of the rare earth element Ln2 from the viewpoint of stabilizing the crystal structure and improving the light emission intensity of light in the near infrared region. When the rare earth element Ln1 is Y, the rare earth element Ln2 is preferably Gd, Sc, or Lu, and more preferably Gd. When the rare earth element Ln1 is Lu, the rare earth element Ln2 is preferably Gd. When the total content of the rare earth element Ln1 and the rare earth element Ln2 is 100% by mol, the content of the rare earth element Ln is preferably in a range of 51% by mol or more and 99% by mol or less, more preferably in a range of 52% by mol or more and 98% by mol or less, and even more preferably in a range of 55% by mol or more and 95% by mol or less. In the case where the rare earth element Ln contains two kinds of rare earth elements Ln1 and Ln2, when the content of the rare earth element Ln1 relative to the total content of the rare earth elements Ln1 and Ln2 falls within the above range, the energy transfer from Ce to Nd is considered to be efficiently performed, and thus the light emission intensity of the fluorescent material having the composition of rare earth aluminate is increased.

In the composition of rare earth aluminate, when the total molar ratio of the rare earth elements Ln1 and Ln2, Ce, and Nd is 3, and the molar ratio of the rare earth element Ln2 is the product of 3 and the parameter w, the parameter w is preferably in a range of 0.01 or more and 0.5 or less. In the case where the rare earth element Ln contained in the host crystal is a mixed crystal of two kinds of the rare earth elements Ln1 and Ln2, in particular, the Ln1 is Y or Lu, and the Ln2 is Gd, when the parameter w representing the amount of one kind of the rare earth element Ln2 among two kinds of the rare earth elements activated by Ce and Nd is in a range of 0.01 or more and 0.5 or less, the light emission having a broad spectrum waveform derived from Ce upon absorbing light from the excitation light source is shifted to the long wavelength side, and the energy transfer from Ce to Nd is facilitated, so that the energy transfer from Ce to Nd can be considered to be efficiently performed. Accordingly, the light emission intensity of the fluorescent material having the composition of rare earth aluminate can be further improved. Also, in the case where the host crystal of the fluorescent material having the composition of rare earth aluminate is a mixed crystal of the rare earth elements Ln1 and Ln2, the atomic arrangement of the host crystal becomes random to some extent, and the ratio of the excitation energy from the excitation light source, which is used for bright line spectrum light emission derived from Nd, increases, so that a first fluorescent material having high light emission intensity can be obtained.

The first fluorescent material preferably contains a fluorescent material having a composition represented by the following formula (II). The fluorescent material having a composition represented by the following formula (II) is able to suppress a decrease in light emission derived from Nd.

$$(Ln1_{1-w-x-y}Ln2_wCe_xNd_y)_3(Al_{1-z}Ga_z)_5O_{12} \quad (II)$$

wherein Ln1 represents at least one rare earth element selected from the group consisting of Y, Gd, Sc, Lu, and La; Ln2 represents at least one rare earth element selected from the group consisting of Y, Gd, Sc, Lu, and La; provided that Ln1 and Ln2 are different elements from each other; and w, x, y, and z satisfy $0.01 \le w \le 0.5$, $0.003 \le x \le 0.015$, $0.002 \le y \le 0.06$, and $0 \le z \le 0.8$, respectively.

The first fluorescent material may contain a fluorescent material having a composition represented by the following formula (II-1). In the fluorescent material having a composition represented by the following formula (II-1), the energy transfer from Ce to Nd is considered to be efficiently performed. In the fluorescent material having a composition represented by the following formula (II-1), the ratio of the excitation energy from the excitation light source, which is used for bright line spectrum light emission derived from Nd, increases, so that a decrease in light emission derived from Nd is suppressed, and the light emission intensity of the fluorescent material can be more improved.

$$(Ln1_{1-w-x-y}Ln2_wCe_xNd_y)_3(Al_{1-z}Ga_z)_5O_{12} \quad (II-1)$$

wherein Ln1 represents Y; Ln2 represents at least one rare earth element selected from the group consisting of Gd, Sc, and Lu; and w, x, y, and z satisfy $0.01 \le w \le 0.5$, $0.003 \le x \le 0.015$, $0.002 \le y \le 0.06$, and $0 \le z \le 0.8$, respectively.

The first fluorescent material may contain a fluorescent material having a composition represented by the following formula (II-2). In the fluorescent material having a composition represented by the following formula (II-2), the energy transfer from Ce to Nd is considered to be efficiently performed; and the ratio of the excitation energy from the excitation light source, which is used for bright line spectrum light emission derived from Nd, increases, so that a decrease in light emission derived from Nd is suppressed, and the light emission intensity of the fluorescent material can be more improved.

$$(Ln1_{1-w-x-y}Ln2_wCe_xNd_y)_3(Al_{1-z}Ga_z)_5O_{12} \quad (II-2)$$

wherein Ln1 represents Lu; Ln2 represents Gd; and w, x, y, and z satisfy $0.01 \le w \le 0.5$, $0.003 \le x \le 0.015$, $0.002 \le y \le 0.06$, and $0 \le z \le 0.8$, respectively.

In the formulae (II), (II-1), and (II-2), the parameter w represents a molar amount of one kind of the rare earth element Ln2 in a mixed crystal containing two kinds of the rare earth elements. In the formulae (II), (II-1), and (II-2), the parameter w preferably satisfies $0.02 \leq w \leq 0.48$, and more preferably satisfies $0.03 \leq w \leq 0.45$. In the formulae (II), (II-1), and (II-2), the parameter x preferably satisfies $0.004 \leq x \leq 0.012$, and more preferably satisfies $0.005 \leq x \leq 0.010$. In the formulae (II), (II-1), and (II-2), the parameter y preferably satisfies $0.004 \leq y \leq 0.040$, and more preferably satisfies $0.005 \leq y \leq 0.030$. When the molar ratio in each composition of Ce and Nd, which are activators of the fluorescent material, falls within the aforementioned range, a fluorescent material having high light emission intensity in the near infrared region can be obtained. In the formulae (II), (II-1), and (II-2), the parameter z preferably satisfies $0 \leq z \leq 0.8$, and more preferably satisfies $0 \leq z \leq 0.6$. When the parameter z satisfies the aforementioned range, a decrease in crystallinity of the garnet crystal structure of the fluorescent material serving as a host can be suppressed.

Method for Producing Fluorescent Material Having Composition of Rare Earth Aluminate As a method for producing a fluorescent material having a rare earth aluminate composition, the following method can be cited. The method for producing a fluorescent material having a composition of rare earth aluminate preferably includes: mixing a compound containing at least one rare earth element Ln selected from the group consisting of Y, Gd, Sc, La, and Lu, a compound containing at least one element selected from Al and Ga, a compound containing Ce, and a compound containing Nd such that, on the basis of the total molar ratio of Al and Ga in the composition of the fluorescent material of 5, when the total molar ratio of the rare earth element Ln, Ce, and Nd is 3; the molar ratio of Ce is the product of 3 and the parameter x; and the molar ratio of Nd is the product of 3 and the parameter y, the parameter x is in a range of 0.003 or more and 0.015 or less, and the parameter y is in a range of 0.002 or more and 0.06 or less, to obtain a raw material mixture; and heat-treating the raw material mixture to obtain a fluorescent material having a composition of rare earth aluminate. The method for producing a fluorescent material having a composition of rare earth aluminate may include a post-treatment step such as classifying the heat-treated product after the heat treatment.

Examples of the compounds contained in the raw material mixture may include oxides, hydroxides, nitrides, oxynitrides, fluorides, and chlorides. These compounds may be hydrates. As the raw material mixture, a metal composed of the rare earth element Ln, Al, Ga, Ce, or Nd may be used, and an alloy containing at least one element of the rare earth element Ln, Al, Ga, Ce, and Nd may also be used. The compounds contained in the raw material mixture are preferably oxides. This is because the oxides do not contain other elements other than the targeted composition compared with any other materials, and a fluorescent material having a desired composition can be readily obtained.

Examples of the compound containing a rare earth element Ln may include $Y_2O_3$, $Y(OH)_3$, YN, $YF_3$, $YCl_3$, $Gd_2O_3$, $Gd(OH)_3$, GdN, $GdF_3$, $GdCl_3$, $Sc_2O_3$, ScN, $ScF_3$, $ScCl_3$, $Lu_2O_3$, $LuF_3$, $LuCl_3$, $La_2O_3$, $La(OH)_3$, $LaF_3$, and $LaCl_3$. Examples of the compound containing Al or Ga may include $Al_2O_3$, $Al(OH)_3$, AlN, AlON, $AlF_3$, $AlCl_3$, $Ga_2O_3$, $Ga(OH)_3$, GaN, $GaF_3$, and $GaCl_3$. Examples of the compound containing Ce may include $CeO_2$, $Ce(OH)_2$, $Ce(OH)_4$, CeN, $CeF_3$, and $CeCl_3$. Examples of the compound containing Nd may include $Nd_2O_3$, $Nd(OH)_3$, NdN, $NdF_3$, and $NdCl_3$.

The raw material mixture may optionally contain a flux such as a halide. When the flux is contained in the raw material mixture, the reaction between the raw materials is promoted, and the solid-phase reaction readily proceeds more uniformly. Examples of the halide may include fluorides and chlorides of a rare earth metal, an alkaline earth metal, and an alkali metal. When a rare earth metal halide is used as the flux, the flux may be added as a compound to be a desired composition of rare earth aluminate. Specific examples of the flux may include barium fluoride ($BaF_2$) and calcium fluoride ($CaF_2$).

As for the raw material mixture, after weighing the respective raw materials in a desired blending ratio, the raw materials may be ground and mixed using a dry grinder such as a ball mill, a vibration mill, a hammer mill, a roll mill, or a jet mill; may be ground and mixed using a mortar with a pestle; may be mixed using a mixing machine such as a ribbon blender, a Henschel mixer, or a V-type blender; or may be ground and mixed using both a dry grinder and a mixing machine. The mixing may be dry-type mixing, or may also be wet-type mixing with a solvent added thereto. The dry-type mixing is preferred. This is because the dry-type mixing can shorten the process time compared to the wet-type mixing, which leads to an improvement in productivity.

From the viewpoint of stability of the crystal structure, the temperature at which the raw material mixture is heat-treated is preferably in a range of 800° C. or more and 1,800° C. or less, more preferably in a range of 900° C. or more and 1,750° C. or less, even more preferably in a range of 1,000° C. or more and 1,700° C. or less, and still more preferably in a range of 1,100° C. or more and 1,650° C. or less. The time period for the heat treatment may vary depending on factors such as the heating rate and the heat treatment atmosphere. The time period for the heat treatment is preferably 1 hour or more, more preferably 2 hours or more, and even more preferably 3 hours or more; and preferably 20 hours or less, more preferably 18 hours or less, and even more preferably 15 hours or less, after reaching at the heat treatment temperature. For the heat treatment, for example, an electric furnace or a gas furnace can be used.

The heat treatment of the raw material mixture can be performed in an inert atmosphere containing argon and nitrogen, a reducing atmosphere containing hydrogen, or an oxidizing atmosphere such as the air. The raw material mixture is preferably heat-treated in a reductive nitrogen atmosphere to obtain a fluorescent material. The atmosphere in which the raw material mixture is heat-treated is more preferably a nitrogen atmosphere containing a reductive hydrogen gas. The fluorescent material having a composition of rare earth aluminum-gallate has a good reactivity of the raw material mixture in a high reducing power atmosphere such as a reducing atmosphere containing hydrogen and nitrogen, and can be heat-treated at atmospheric pressure without being pressurized. For the heat treatment, for example, an electric furnace or a gas furnace can be used.

The resulting fluorescent material may be wet dispersed and subjected to post-treatment steps such as wet-type sieving, dehydration, drying, and dry-type sieving. By performing these post treatment steps, a fluorescent material having a desired average particle diameter can be obtained. For example, the heat-treated fluorescent material is dispersed in a non-aqueous organic solvent or an aqueous solvent; a solvent stream is allowed to flow onto the dispersed fluorescent material placed on a sieve while applying various vibrations through the sieve; the calcined product is passed through a mesh to undergo a wet-type sieving; and subsequently, the resulting product can be dehydrated, dried, and passed through a dry-type sieve, thereby obtaining a fluorescent material having a desired average particle diameter. By dispersing the heat-treated fluorescent material in an aqueous medium, impurities such as a calcination residue of the flux and unreacted components of the raw materials can be eliminated. For the wet-type dispersion, a dispersion medium such as an alumina ball or a zirconia ball may be used.

Second Fluorescent Material

The illumination device may have a second fluorescent material that converts the wavelength of light emitted from the excitation light source and emits light having a light emission peak wavelength in a range of less than 780 nm. The second fluorescent material preferably converts the wavelength of light emitted from the excitation light source having a light emission peak wavelength in a range of 250 nm or more and 500 nm or less, and emits light having a light emission peak wavelength in a range of less than 780 nm. By having the second fluorescent material, the illumination device is able to emit light in the visible light region of a wavelength range different from that of the excitation light source, and an illumination device which is improved in visibility even for an object other than a living body and can be used comfortably, can be provided.

The second fluorescent material preferably contains at least one fluorescent material selected from the group consisting of a second fluorescent material A that emits light having a light emission peak wavelength in a range of 430 nm or more and less than 485 nm, a second fluorescent material B that emits light having a light emission peak wavelength in a range of 485 nm or more and less than 610 nm, and a second fluorescent material C that emits light having a light emission peak wavelength in a range of 610 nm or more and less than 780 nm, wherein each of the second fluorescent materials A, B, and C converts the wavelength of light emitted from the excitation light source.

The second fluorescent material A is excited by light emitted from the excitation light source, to emit blue-violet to blue light having a light emission peak wavelength in a range of 430 nm or more and less than 485 nm. In the illumination device including the light emitting device containing the second fluorescent material A as a light source, blue component light, which is insufficient in the light from the excitation light source, is supplemented by the second fluorescent material A.

The second fluorescent material A preferably includes at least one second fluorescent material A selected from the group consisting of a fluorescent material containing an Eu-activated halogen-containing alkaline earth metal phosphate containing at least one element selected from the group consisting of alkaline earth metal elements, and at least one element selected from the group consisting of halogens, in the composition; and a fluorescent material containing an Eu-activated alkaline earth metal silicate containing at least one element selected from the group consisting of Ba, Sr, and Ca, and Mg, in the composition. The second fluorescent material A may include two or more kinds of the second fluorescent materials A. More preferably, the second fluorescent material A includes a fluorescent material containing an Eu-activated halogen-containing alkaline earth metal phosphate containing at least one element selected from the group consisting of alkaline earth metal elements, and at least one element selected from the group consisting of halogens, in the composition.

The second fluorescent material A preferably includes at least one second fluorescent material A selected from the group consisting of a fluorescent material having a composition represented by the following formula (III) and a fluorescent material having a composition represented by the following formula (IV), and may include two or more kinds of the second fluorescent materials A. More preferably, the second fluorescent material A includes a fluorescent material having a composition represented by the following formula (III).

$$(Ca,Sr,Ba,Mg)_{10}(PO_4)_6(F,Cl,Br,I)_2:Eu \quad (III)$$

$$(Ba,Sr,Ca)_3MgSi_2O_8:Eu \quad (IV)$$

In the fluorescent material compositions represented by the formulae (III) and (IV) as well as the formulae (V) to (XII) described below, plural elements sectioned by the comma (,) mean that at least one element of these plural elements is contained in the composition. The plural elements sectioned by the comma (,) in the compositional formulae mean that at least one element selected from the plural elements thus sectioned by the comma is contained in the composition and two or more kinds of the plural elements may be contained in combination.

The second fluorescent material B is excited by light emitted from the excitation light source, to emit blue-green to orange light having a light emission peak wavelength in a range of 485 nm or more and less than 610 nm. In the illumination device including the light emitting device containing the second fluorescent material B as a light source, light in the visible light region, which is insufficient in the light from the excitation light source and the light of which the wavelength is converted by the second fluorescent material A, is supplemented by the second fluorescent material B.

The second fluorescent material B preferably includes at least one second fluorescent material B selected from the group consisting of: a fluorescent material containing a Ce-activated rare earth aluminate containing at least one element selected from the group consisting of rare earth elements other than Ce, and Al, and optionally Ga, in the composition; a fluorescent material containing an Eu-activated halogen-containing alkaline earth metal silicate containing at least one alkaline earth metal element selected from the group consisting of Ca, Sr, and Ba, and at least one halogen element selected from the group consisting of F, Cl, and Br, in the composition; a fluorescent material containing an Eu-activated β-SiAlON; a fluorescent material containing a Ce-activated rare earth nitride containing at least one rare earth element selected from the group consisting of La, Y, and Gd, and Si, in the composition; and a fluorescent material containing an Eu-activated alkaline earth metal silicate. The second fluorescent material B may include two or more kinds of the second fluorescent materials B.

The second fluorescent material B preferably contains at least one fluorescent material selected from the group consisting of a fluorescent material having a composition represented by the following formula (V), a fluorescent material having a composition represented by the following formula (VI), a fluorescent material having a composition represented by the following formula (VII), a fluorescent material having a composition represented by the following formula (VIII), and a fluorescent material having a composition represented by the following formula (IX); and may contain two or more kinds of the fluorescent materials.

$$(Lu,Y,Gd,Tb)_3(Al,Ga)_5O_{12}:Ce \quad (V)$$

$$(Ca,Sr,Ba)_8MgSi_4O_{16}(F,Cl,Br)_2:Eu \quad (VI)$$

$$Si_{6-z}Al_zO_zN_{8-z}:Eu(0<z<4.2) \quad (VII)$$

$$(La,Y,Gd)_3Si_6N_{11}:Ce \quad (VIII)$$

$$(Ba,Sr,Ca,Mg)_2SiO_4:Eu \quad (IX)$$

The second fluorescent material C is excited by light emitted from the excitation light source, to emit red light having a light emission peak wavelength in a range of 610 nm or more and less than 780 nm. In the illumination device including the light emitting device containing the second fluorescent material C as a light source, light having a color component in the visible light region, which is insufficient in the light from the excitation light source as well as the light of which the wavelength is converted by each of the second fluorescent materials A and B, is supplemented by the second fluorescent material C.

The second fluorescent material C preferably includes at least one second fluorescent material C selected from the group consisting of: a fluorescent material containing an Eu-activated nitride containing at least one element selected from the group consisting of alkaline earth metal elements, and Al, and Si, in the composition; a fluorescent material containing an Eu-activated nitride containing at least one element selected from the group consisting of alkaline earth metal elements, and Si, in the composition; and a fluorescent material containing an Eu-activated nitride containing at least one element selected from the group consisting of alkaline earth metal elements, and Li, and Al, in the composition. The second fluorescent material C may include two or more kinds of the second fluorescent materials C. More preferably, the second fluorescent material C includes a fluorescent material containing an Eu-activated nitride containing at least one element selected from the group consisting of alkaline earth metal elements, and Al, and Si, in the composition.

The second fluorescent material C preferably contains at least one fluorescent material selected from the group consisting of a fluorescent material having a composition represented by the following formula (X), a fluorescent material having a composition represented by the following formula (XI), and a fluorescent material having a composition represented by the following formula (XII); and may contain two or more kinds of the fluorescent materials. More preferably, the second fluorescent material C contains a fluorescent material having a composition represented by the following formula (X).

$$(Sr,Ca)AlSiN_3:Eu \quad (X)$$

$$(Ca,Sr,Ba)_2Si_5N_8:Eu \quad (XI)$$

$$(Sr,Ca)LiAl_3N_4:Eu \quad (XII)$$

By containing the second fluorescent material in the illumination device, the visibility of the presence of a living body and the position of blood vessels or the like in the living body can be improved by the light having a wavelength converted by the first fluorescent material, and the visibility for an object other than the living body is also improved by the light emitted from the excitation light source and the light having a wavelength converted by the second fluorescent material, so that an illumination device which can be suitably used can be provided. For example, by containing a second fluorescent material having a light emission peak in a red region, the position or thickness of blood vessels can be easily visually recognized.

When the illumination device contains the second fluorescent material, the mass ratio of the second fluorescent material A to the total mass of the second fluorescent material is preferably in a range of 1.0% by mass or more and 50.0% by mass or less; the mass ratio of the second fluorescent material B to the total mass of the second fluorescent material is preferably in a range of 45.0% by mass or more and 99.0% by mass or less; and the mass ratio of the second fluorescent material C to the total mass of the second fluorescent material is preferably in a range of 0% by mass or more and 50.0% by mass or less. When the mass ratio of each of the second fluorescent materials A, B, and C to the total mass of the second fluorescent material falls within the above ranges, the visibility of the object can be improved by the light emitted from the excitation light source and the light having a wavelength converted by the second fluorescent material. The mass ratio of the second fluorescent material A to the total mass of the second fluorescent material may be in a range of 1.0% by mass or more and 49.0% by mass or less; the mass ratio of the second fluorescent material B to the total mass of the second fluorescent material may be in a range of 45.0% by mass or more and 98.0% by mass or less; and the mass ratio of the second fluorescent material C to the total mass of the second fluorescent material may be in a range of 1.0% by mass or more and 49.0% by mass or less. The mass ratio of the second fluorescent material A to the total mass of the second fluorescent material may be in a range of 2.0% by mass or more and 48.0% by mass or less; the mass ratio of the second fluorescent material B to the total mass of the second fluorescent material may be in a range of 45.0% by mass or more and 96.0% by mass or less; and the mass ratio of the second fluorescent material C to the total mass of the second fluorescent material may be in a range of 2.0% by mass or more and 48.0% by mass or less.

Figure 3:
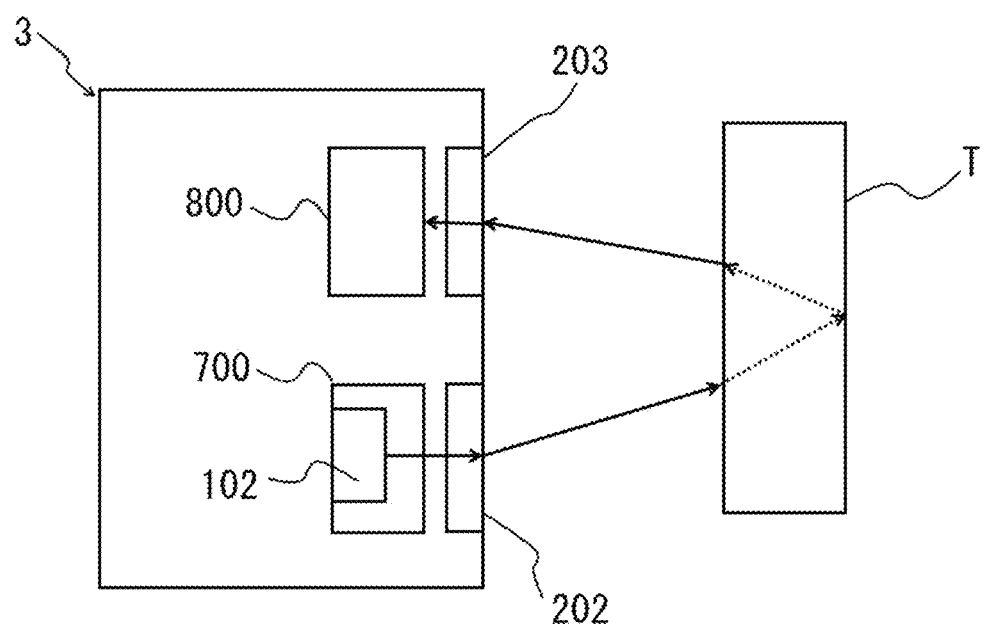
FIG. 3 is a diagram schematically illustrating a schematic structure of an illumination device according to a third embodiment of the present disclosure.

FIG. 3 is a diagram schematically illustrating a schematic structure of an illumination device 3 according to a third embodiment of the present disclosure. The illumination device 3 includes a light emitting unit 700 including a light emitting device 102 serving as a light source, and a first cut filter 202 that blocks light in a wavelength range of 870 nm or less. The illumination device 3 includes a light receiving unit 800 that receives light emitted from the light emitting device 102, transmitted through an object T, and emitted from the object T. The illumination device 3 may include a second cut filter 203 that is disposed at a position where light incident on the light receiving unit 800 and blocks light in a specific wavelength range. The light receiving unit 800 may include a light detector that detects light incident on the light receiving unit 800. For example, by analyzing light emitted from the illumination device 3 through the living body serving as the object T, and emitted out of the living body, more detailed information on the inside of the living body can be obtained without contacting the object T. For example, in a living body, the light absorptance of blood in a near-infrared region changes as the blood flow changes due to the heartbeat. By illuminating the living body with light in a wavelength range of a near-infrared region where the absorptance of the light absorbers in the living body is low from the illumination device 3, and receiving light transmitted through the living body and emitted from the living body by the light receiving unit 800 to measure the light intensity, information on changes in blood pulsation can be obtained. In addition, the light transmitted through the living body and emitted from the surface of the living body is multiply scattered in the living body, and thus the intensity of the surface reflected light emitted from the living body tends to be higher than that of light emitted from an object other than the living body. When the living body can be illuminated from the illumination device 3 with light in a wavelength range which is easily transmitted through the living body, the presence of the living body can also be detected by analyzing the surface reflected light emitted from the living body.

Figure 4:
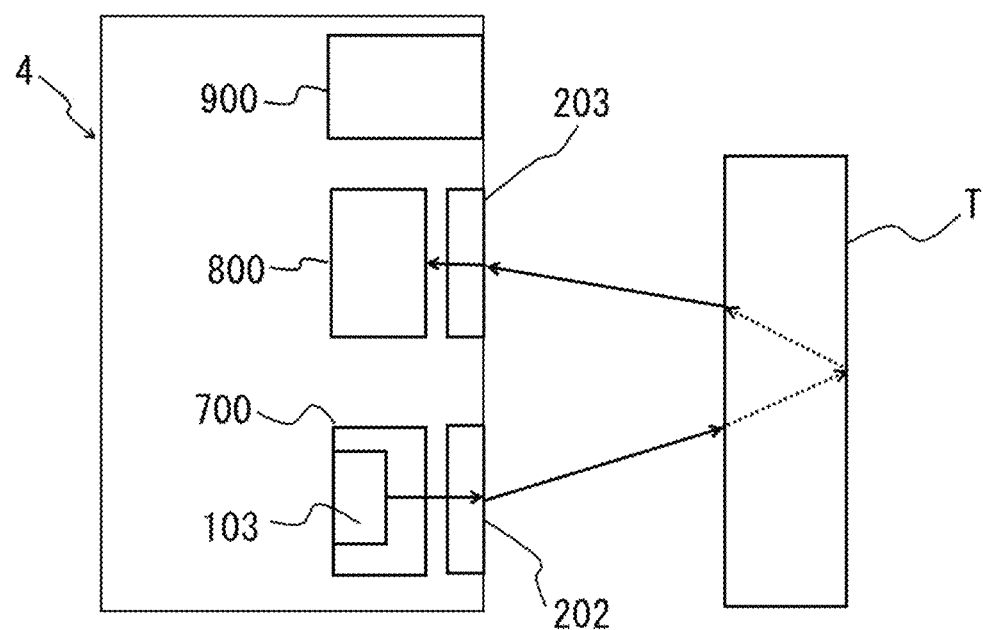
FIG. 4 is a diagram schematically illustrating a schematic structure of an infrared camera-equipped illumination device according to a fourth embodiment of the present disclosure.

FIG. 4 is a diagram schematically illustrating a schematic structure of an illumination device 4 according to a fourth embodiment of the present disclosure. The illumination device 4 includes a light emitting unit 700 including a light emitting device 103 serving as a light source, a first cut filter 202 that blocks light in a wavelength range of 870 nm or less, a light receiving unit 800 that receives light emitted from an object T, and an infrared camera 900 that photographs an object such as the object T. The illumination device 4 may include a second cut filter 203 that is disposed at a position where light incident on the light receiving unit 800 and blocks light in a specific wavelength range. In the illumination device 4, a living body serving as the object T is illuminated with light in a wavelength range where the absorptance of the light absorbers in the living body is low from the light emitting device 103, and an image in which blood vessels or the like in the living body is emphasized by the light transmitting through the blood vessels or the like in the living body, can be photographed by the infrared camera 900.

The illumination device is able to emit both light in a visible light region and light in a near-infrared region, and to improve visibility in a living body and an object other than the living body. Thus, the illumination device can be suitably used for medical lighting in medical sites, such as lighting for surgery.

EXAMPLES

The present disclosure is hereunder specifically described with reference to the following Examples. The present disclosure is not limited to these Examples.

Example 1

A light emitting device including a molded body having a concave portion, a light emitting element disposed on the bottom surface of the concave portion, and a wavelength conversion member for covering the light emitting element disposed on the bottom surface of the concave portion, was produced. As the excitation light source of the light emitting device, a GaN-based semiconductor light emitting element that emits light having a light emission peak wavelength of 440 nm was used. The light emitting element was face-down mounted on the bottom surface of the concave portion via a conductive member mainly composed of AuSn. In the wavelength conversion member, a resin composition containing a silicone resin and a first fluorescent material having a composition represented by YAG:Ce,Nd in which the wavelength of light emitted from the light emitting element serving as the excitation light source was converted to emit light having a light emission peak wavelength in a range of 780 nm or more and 1,600 nm or less, was disposed in the concave portion by potting. An illumination device including the produced light emitting device as a light source and a cut filter for blocking light in a wavelength range of 870 nm or less, was produced. The cut filter was movably disposed so as to block light emitted from the light emitting device serving as a light source in a wavelength range of 870 nm or less, or not to block the light.

Comparative Example 1

A light emitting device was produced in the same manner as in Example 1 except that a fluorescent material having a composition represented by YAG:Ce, which did not contain Nd as an activating element, was used in place of the first fluorescent material having a composition represented by YAG:Ce,Nd. An illumination device was produced in the same manner as in Example 1 by using the light emitting device and a cut filter for blocking light in a wavelength range of 870 nm or less.

Evaluation of Light Emitting Device

The light emitting devices of Example and Comparative Example were evaluated by the following methods.

Light Emission Spectrum and Total Radiant Flux

Figure 5:
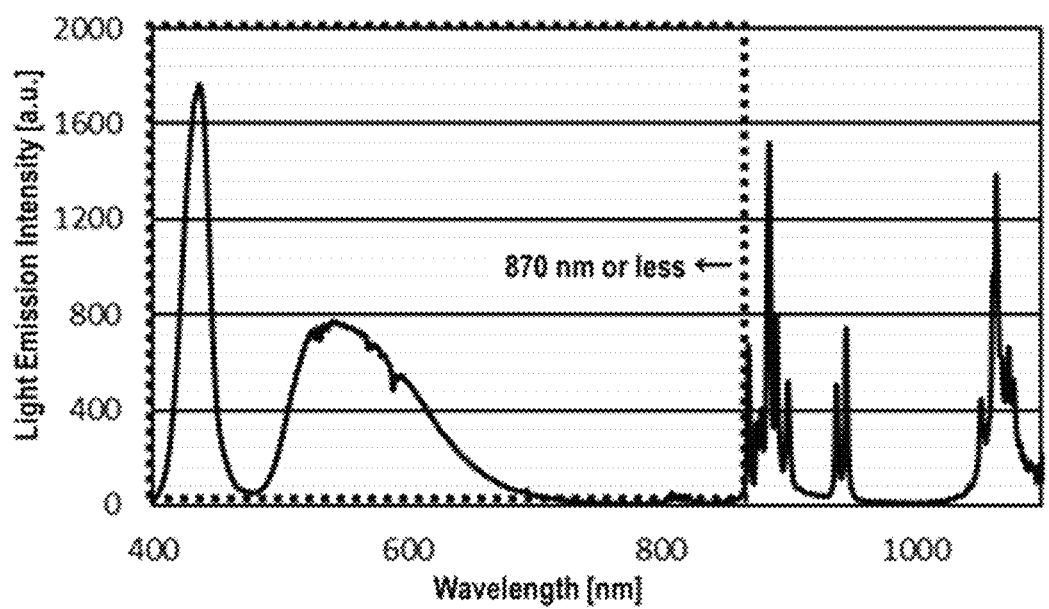
FIG. 5 is a graph showing a light emission spectrum of a light emitting device used as a light source of an illumination device according to Example 1.
Figure 6:
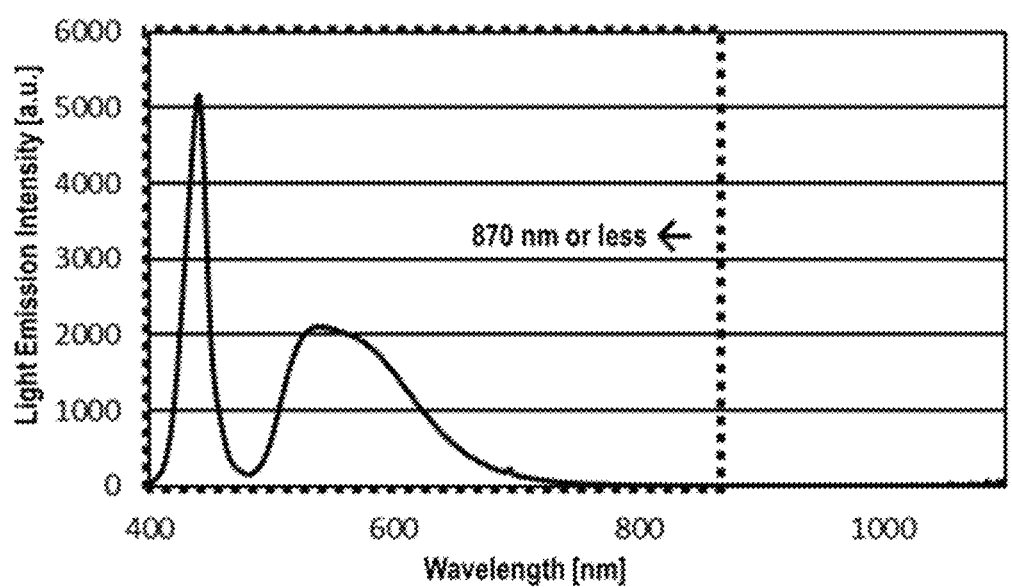
FIG. 6 is a graph showing a light emission spectrum of a light emitting device used as a light source of an illumination device according to Comparative Example 1.

As for the light emitting devices of Example 1 and Comparative Example 1, the light emission spectrum indicating the light emission intensity with respect to the wavelength of light emitted from each light emitting device was measured without being blocked by the cut filter by using a total luminous flux measuring apparatus (manufactured by Nichia Corporation) with an integrating sphere. FIG. 5 shows a light emission spectrum of the light emitting device used as a light source of the illumination device according to Example 1, and FIG. 6 shows a light emission spectrum of the light emitting device used as a light source of the illumination device according to Comparative Example 1. The total radiant flux of 870 nm or more emitted from the light emitting device in each of Example 1 and Comparative Example 1 was measured using the total luminous flux measuring apparatus with an integrating sphere.

Chromaticity (x, y)

As for the light emitting devices in Example 1 and Comparative Example 1, the chromaticity x, y in chromaticity coordinates of Commission international del'eclairage (CIE) 1931 color system was measured using an optical measurement system combining a multichannel spectrometer and an integrating sphere. The average color rendering index Ra and the red special color rendering index R9 were measured according to JIS Z8726. The input current at the time of measuring the color rendering index Ra was 20 mA to be a rated forward current, and the forward voltage at that time was 3 V.

TABLE 1

| | | | | | Average Color Rendering Index | Color Rendering Index |
|---|---|---|---|---|---|---|
| | Fluorescent Material | Total Radiant Flux (mW) | Chromaticity | | | |
| | | | x | y | Ra | R9 |
| Example 1 | YAG: Ce, Nd | 30.2 | 0.307 | 0.332 | 60.8 | −57.2 |
| Comparative Example 1 | YAG: Ce | 1.7 | 0.308 | 0.330 | 63.0 | −52.0 |

The light emitting device of Example 1 had a total radiant flux of 870 nm or more higher than that of Comparative Example 1. There was no large difference in chromaticity, average color rendering index Ra, and special color rendering index R9 indicating red between the light emitted from the light emitting device of Example 1 and the light emitted from the light emitting device of Comparative Example 1, and there was also no significant difference in the view of the object evaluated with the naked eye. Thus, it is presumed that the visibility of general objects to be illuminated with each light was almost the same.

As shown in FIG. 5, it can be confirmed that the light emission spectrum of the light emitted from the light emitting device of Example 1 had a plurality of light emission peaks in a wavelength range of more than 870 nm. On the other hand, as shown in FIG. 6, it is confirmed that the light emission spectrum of the light emitted from the light emitting device of Comparative Example 1 had no light emission peak in a wavelength range of more than 870 nm.

Illumination Device Evaluation 1

Figure 7:
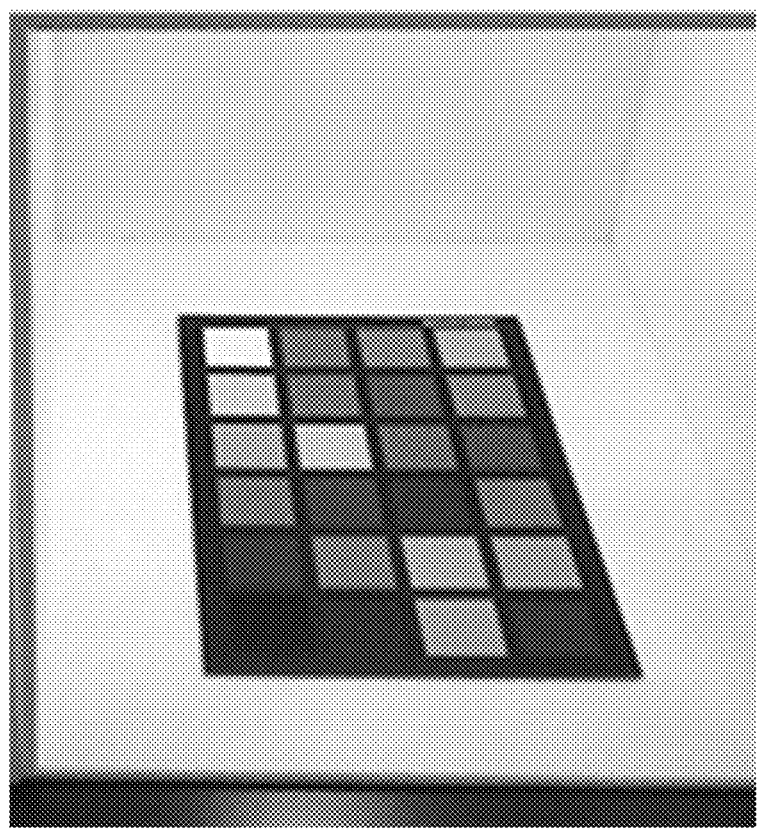
FIG. 7 is an image obtained by photographing an object illuminated by an infrared camera-equipped illumination device according to Example 1, using a visible light camera without using a cut filter.
Figure 8:
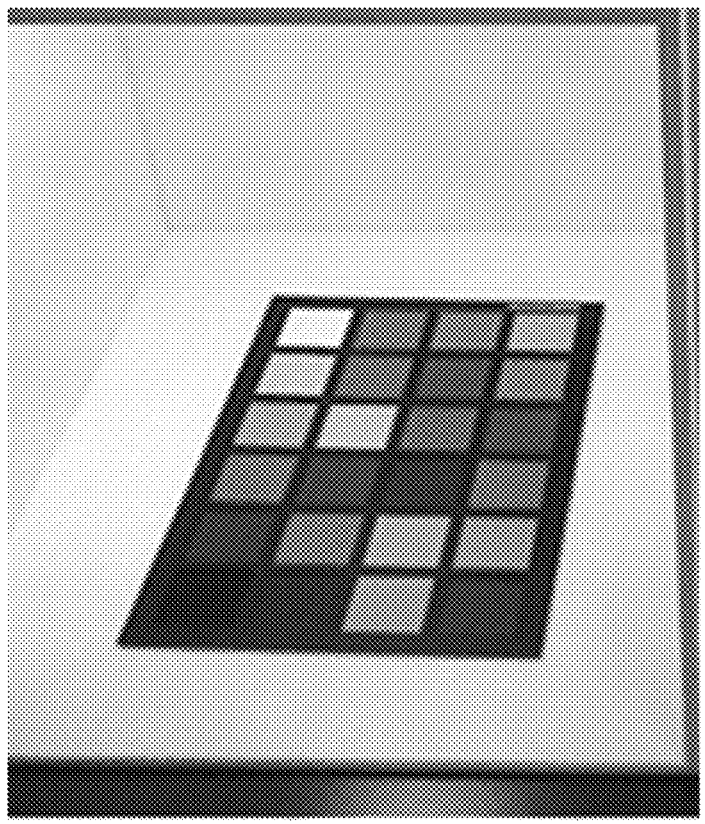
FIG. 8 is an image obtained by photographing an object illuminated by an infrared camera-equipped illumination device according to Comparative Example 1, using a visible light camera without using a cut filter.

An infrared camera-equipped illumination device of the embodiment shown in FIG. 4 was produced using the light emitting device used in Example 1 as a light source, in order to confirm the view of the object illuminated by the illumination device with the naked eye. Also, an infrared camera-equipped illumination device of the embodiment shown in FIG. 4 was produced using the light emitting device used in Comparative Example 1 as a light source. FIG. 7 is an image showing a color plate with various colors illuminated with light emitted from the infrared camera-equipped illumination device using the light emitting device of Example 1, without using a cut filter. FIG. 8 is an image showing a color plate with various colors illuminated with light emitted from the infrared camera-equipped illumination device using the light emitting device of Comparative Example 1, without using a cut filter. In FIGS. 7 and 8, almost no change was observed when viewed with the naked eye, and the visibility of each of the general objects was almost the same.

Illumination Device Evaluation 2

Figure 9:
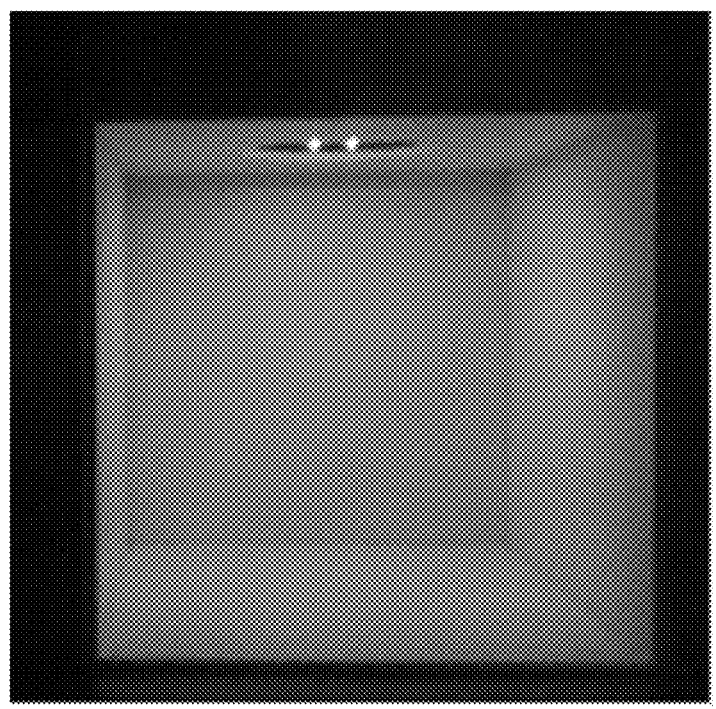
FIG. 9 is an image obtained by photographing an object illuminated by the infrared camera-equipped illumination device according to Example 1, using the infrared camera while blocking light in a wavelength range of 870 nm or less with a cut filter.
Figure 10:
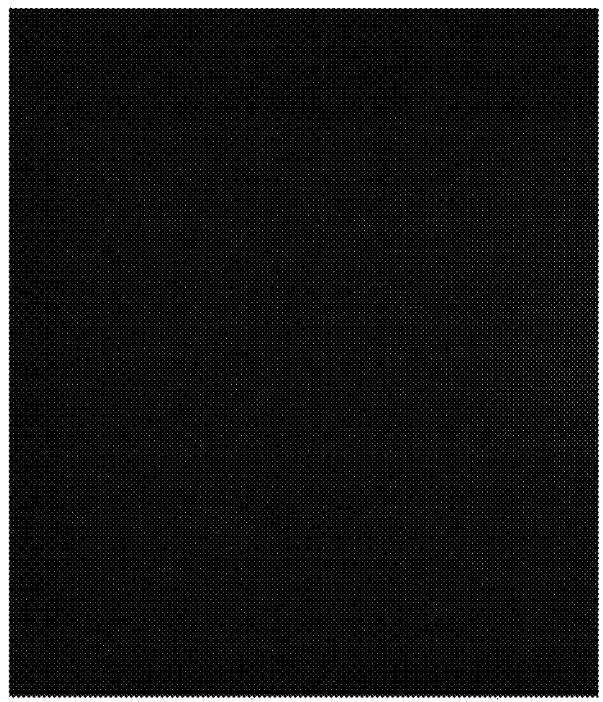
FIG. 10 is an image obtained by photographing an object illuminated by the infrared camera-equipped illumination device according to Comparative Example 1, using the infrared camera while blocking light in a wavelength range of 870 nm or less with a cut filter.

In order to confirm the view of an object illuminated by the illumination device and photographed by an infrared camera, light in a wavelength range of 870 nm or less was blocked with a cut filter, and illuminated to the object from the illumination device of each of Example 1 and Comparative Example 1, thereby photographing the object with an infrared camera. FIG. 9 is an image obtained by photographing the object illuminated by the illumination device according to Example 1, using the infrared camera while blocking light in a wavelength range of 870 nm or less with a cut filter. FIG. 10 is an image obtained by photographing the object illuminated by the illumination device according to Comparative Example 1, using the infrared camera while blocking light in a wavelength range of 870 nm or less with a cut filter. In the case of illuminating with the illumination device of Example 1 as shown in FIG. 9, the object in the image could be clearly confirmed with a bright even when the light in a wavelength range of 870 nm or less was blocked by the cut filter. In the case of illuminating with the illumination device of Comparative Example 1 as shown in FIG. 10, the image was completely black and nothing was confirmed from the image when the light in a wavelength range of 870 nm or less was blocked by the cut filter.

Illumination Device Evaluation 3

Figure 11:
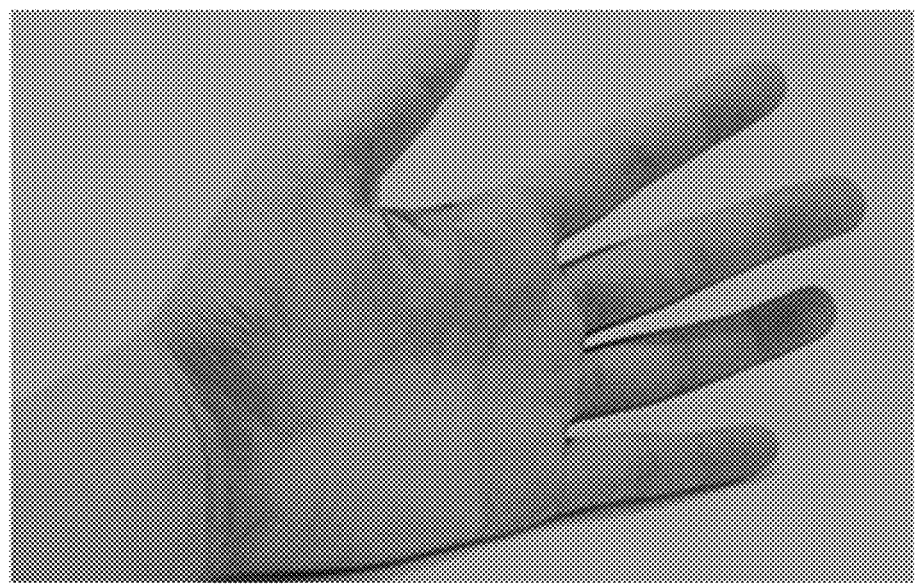
FIG. 11 is an image obtained by photographing a palm illuminated from above by the infrared camera-equipped illumination device according to Example 1, using a visible light camera without using a cut filter.

FIG. 11 is an image obtained by photographing a palm illuminated from above by the infrared camera-equipped illumination device of the embodiment shown in FIG. 4 using the light emitting device of Example 1 as a light source, without using a cut filter. The view of the image of the palm illuminated from above without blocking light in a wavelength range of 870 nm or less by a cut filter was almost same as the general view by the naked eye, and the general visibility was not lowered.

Illumination Device Evaluation 4

Figure 12:
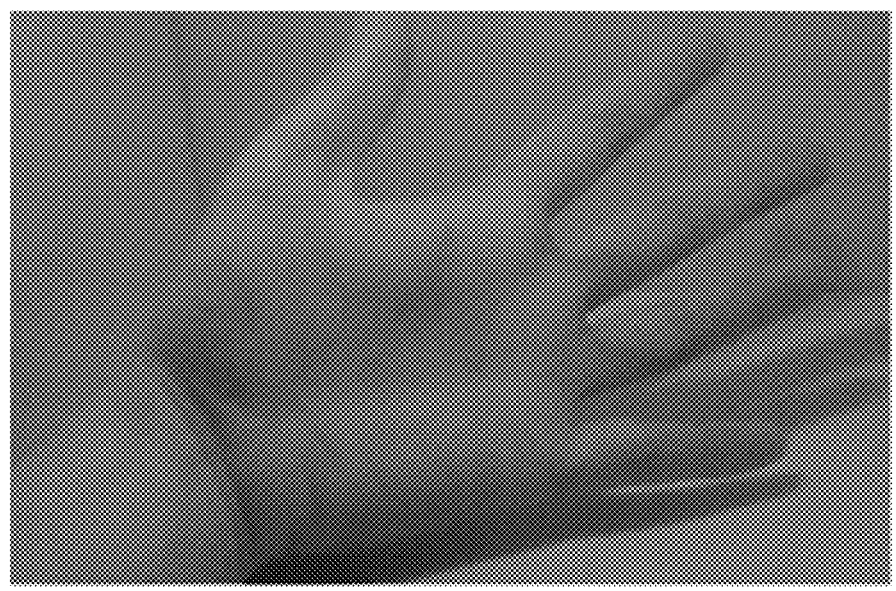
FIG. 12 is an image obtained by photographing a palm illuminated from above by the infrared camera-equipped illumination device according to Example 1, using the infrared camera while blocking light in a wavelength range of 870 nm or less with a cut filter.

FIG. 12 is an image obtained by photographing a palm illuminated from above by the infrared camera-equipped illumination device of the embodiment shown in FIG. 4 using the light emitting device of Example 1 as a light source, by using the infrared camera while blocking light in a wavelength range of 870 nm or less with a cut filter. As shown in FIG. 12, when the light in a wavelength range of 870 nm or less was blocked and the light in a wavelength range of more than 870 nm was illuminated to the object, the blood vessel portions inside the palm were emphasized. From these results, it is confirmed that, by illuminating the objects with the light in a wavelength range of more than 870 nm from the illumination device of the embodiment shown in FIG. 4, the visibility of the presence of the living body and the position of the blood vessels or the like in the living body could be improved without lowering the visibility of the general object other than the living body.

Illumination Device Evaluation 5

Figure 13:
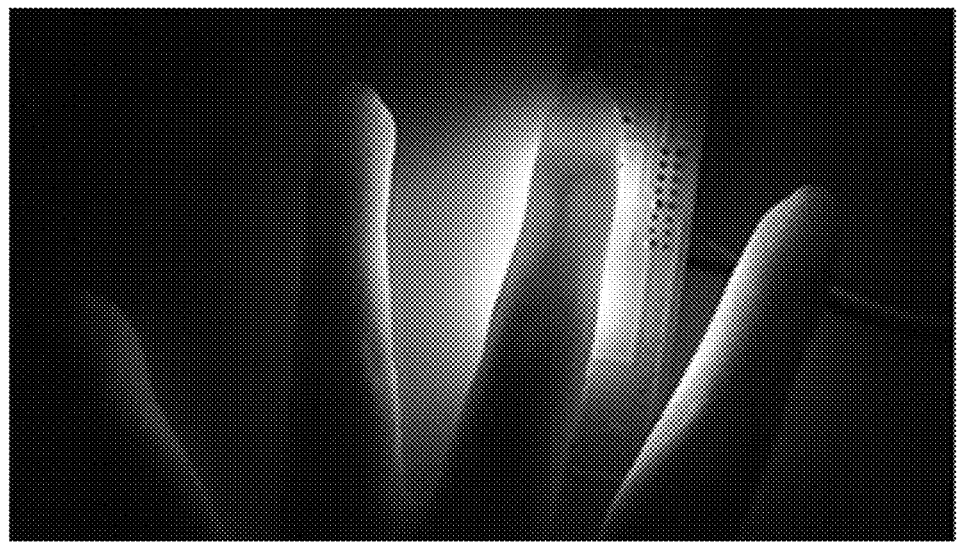
FIG. 13 is an image obtained by photographing a finger illuminated from below by the infrared camera-equipped illumination device according to Example 1, using the infrared camera while blocking light in a wavelength range of 870 nm or less with a cut filter.

FIG. 13 is an image obtained by photographing a finger illuminated from below by the infrared camera-equipped illumination device of the embodiment shown in FIG. 4 using the light emitting device of Example 1 as a light source, by using the infrared camera while blocking light in a wavelength range of 870 nm or less with a cut filter. As shown in FIG. 13, when the light in a wavelength range of 870 nm or less was blocked and the light in a wavelength range of more than 870 nm was illuminated to the object, the blood vessels inside the finger were more emphasized. By illuminating the objects with the light in a wavelength range of more than 870 nm from the illumination device of the embodiment shown in FIG. 4, the visibility of the presence of the living body and the position of the blood vessels or the like in the living body could be more improved without lowering the visibility of the general object other than the living body.

The illumination device according to the embodiment of the present disclosure can be used as an illumination device for vehicles or general lighting, and an illumination device for medical lighting.

The invention claimed is:

1. An illumination device comprising
    an excitation light source,
    a first fluorescent material that converts the wavelength of light emitted from the excitation light source and emits light having a light emission peak wavelength in a range of 780 nm or more and 1,600 nm or less, and
    a cut filter that blocks light in a wavelength range of 870 nm or less,
    wherein the first fluorescent material contains a fluorescent material having a composition of rare earth aluminate containing Ce and Nd.

2. The illumination device according to claim 1, wherein the excitation light source emits light having a light emission peak wavelength in a range of 250 nm or more and 500 nm or less.

3. The illumination device according to claim 1, further comprising a second fluorescent material that converts the wavelength of light emitted from the excitation light source and emits light having a light emission peak wavelength in a range of less than 780 nm.

4. The illumination device according to claim 1, wherein the excitation light source is a GaN-based semiconductor light emitting element.

5. The illumination device according to claim 1, wherein the first fluorescent material contains a fluorescent material having a composition of rare earth aluminate containing: at least one rare earth element Ln selected from the group consisting of Y, Gd, Sc, Lu, and La; Al; Ce; Nd; and optionally Ga,
    wherein, when the total molar ratio of Al and Ga in the composition is 5, the total molar ratio of the Ln, Ce, and Nd is 3, the molar ratio of Ce is the product of 3 and x, the molar ratio of Nd is the product of 3 and y, x is a number in a range of 0.003 or more and 0.015 or less, and y is a number in a range of 0.002 or more and 0.06 or less.

6. The illumination device according to claim 1, wherein the first fluorescent material contains a fluorescent material having a composition represented by the following formula (I):

$$(Ln_{1-x-y}Ce_xNd_y)_3(Al_{1-z}Ga_z)_5O_{12} \quad (I)$$

wherein Ln represents at least one rare earth element selected from the group consisting of Y, Gd, Sc, Lu, and La; and x, y, and z satisfy $0.003 \leq x \leq 0.015$, $0.002 \leq y \leq 0.06$, and $0 \leq z \leq 0.8$, respectively.

7. The illumination device according to claim 3, wherein the second fluorescent material contains at least one fluorescent material selected from the group consisting of
    a second fluorescent material A that converts the wavelength of light emitted from the excitation light source and emits light having a light emission peak wavelength in a range of 430 nm or more and less than 485 nm,
    a second fluorescent material B that converts the wavelength of light emitted from the excitation light source and emits light having a light emission peak wavelength in a range of 485 nm or more and less than 610 nm, and
    a second fluorescent material C that converts the wavelength of light emitted from the excitation light source and emits light having a light emission peak wavelength in a range of 610 nm or more and less than 780 nm.

8. An infrared camera-equipped illumination device comprising
    the illumination device according to claim 1, and
    an infrared camera that photographs an object illuminated by the illumination device.

9. An infrared camera-equipped illumination device comprising
    the illumination device according to claim 3, and
    an infrared camera that photographs an object illuminated by the illumination device.

10. The illumination device according to claim 1, further comprising at least two or more excitation light sources, at least one of the excitation light sources having a light emission peak wavelength in a range of 380 nm or more and 420 or less.

11. The illumination device according to claim 1, further comprising a plurality of cut filters, and a cut filter selecting means capable of selecting and using any of the plurality of cut filters.

12. The illumination device according to claim 7, wherein
    the mass ratio of the second fluorescent material A to the total mass of the second fluorescent material is in a range of 1.0% by mass or more and 50.0% by mass or less;
    the mass ratio of the second fluorescent material B to the total mass of the second fluorescent material is in a range of 45.0% by mass or more and 99.0% by mass or less; and
    the mass ratio of the second fluorescent material C to the total mass of the second fluorescent material is in a range of 0% by mass or more and 50.0% by mass or less.

13. The illumination device according to claim 1, further comprising a light receiving unit that receives light transmitted through an object and emitted from the object.

14. The illumination device according to claim 13, further comprising a second cut filter that is disposed at a position where light incident on the light receiving unit and blocks light in a specific wavelength range.

15. The illumination device according to claim 1, wherein the cut filter is movably disposed to block light emitted in a specific wavelength range.

* * * * *